United States Patent [19]

Takeda et al.

[11] Patent Number: 5,150,181
[45] Date of Patent: Sep. 22, 1992

[54] AMORPHOUS THIN FILM SEMICONDUCTOR DEVICE WITH ACTIVE AND INACTIVE LAYERS

[75] Inventors: Shinichi Takeda, Hiratsuka; Masato Yamanobe, Machida, both of Japan

[73] Assignee: Canon Kabushiki Kaisha, Tokyo, Japan

[21] Appl. No.: 675,280

[22] Filed: Mar. 26, 1991

[30] Foreign Application Priority Data

Mar. 27, 1990 [JP] Japan ............... 2-078401
Mar. 27, 1990 [JP] Japan ............... 2-078402

[51] Int. Cl.⁵ ........................... H01L 27/14
[52] U.S. Cl. ........................... 357/30; 357/22; 357/23.7; 357/59; 357/32; 357/16
[58] Field of Search ............. 357/30 K, 30 I, 30 R, 357/30 H, 23.7, 32, 30 E, 16, 2, 59

[56] References Cited

U.S. PATENT DOCUMENTS

| | | | |
|---|---|---|---|
| 4,441,113 | 4/1984 | Madan | 357/30 K X |
| 4,522,663 | 6/1985 | Oushinsky et al. | 357/30 K X |
| 4,658,280 | 4/1987 | Komatsu et al. | 357/30 K |
| 4,886,962 | 12/1989 | Gofuku et al. | 357/30 K X |

FOREIGN PATENT DOCUMENTS

| | | |
|---|---|---|
| 59-061964 | 4/1984 | Japan . |
| 60-101940 | 6/1985 | Japan . |
| 62-08559 | 5/1986 | Japan . |
| 61-029170 | 7/1986 | Japan . |
| 62-013371 | 6/1987 | Japan . |
| 62-013274 | 7/1987 | Japan . |
| 63-009157 | 1/1988 | Japan . |
| 1-137674 | 5/1989 | Japan . |

OTHER PUBLICATIONS

K. Hiranoko et al., "Influence of an SiNx:H Gate Insulator on an Amorphous Silicon Thin-Film Transistor", *J. of Applied Physics*, vol. 62 (5), Sep. 1, 1987, pp. 2129-2134.

K. Hiranoko et al., "Effect of SiN$_x$:H Layered Structures", *J. of Applied Physics*, vol. 10 (12), Dec. 15, 1986, pp. 4204-4208.

*Primary Examiner*—William Mintel
*Attorney, Agent, or Firm*—Fitzpatrick, Cella, Harper & Scinto

[57] ABSTRACT

A film semiconductor device comprises at least active semiconductor layer, inactive semiconductor layer, ohmic layer and metal layer respectively laminated sequentially one after another on the substrate. Electrodes are formed by the ohmic layer and the metal layer.

27 Claims, 19 Drawing Sheets

AMORPHOUS THIN FILM SEMICONDUCTOR DEVICE WITH ACTIVE AND INACTIVE LAYERS

BACKGROUND OF THE INVENTION

1. Field of the Invention

The present invention relates to the thin film semiconductor device which may be used preferably for display, image scanner, etc., in particular the thin film semiconductor wherein uniformity and reliability of electric characteristics may be improved even when the area of thin film transistor and thin film transistor type optical sensor is enlarged.

2. Related Background Art

In recent years, with the progress of office automation, input-output devices such as display, image scanner, etc. are regarded to be important elements as the man-machine interface of OA apparatus such as word processor, personal computer facsimile, etc. and there is a demand for light-weight, thin and low priced elements.

From such viewpoints, there has been development of the active matrix type liquid crystal display which is obtained by forming a thin film semiconductor. Examples of the development are hydrogenated amorphous silicon, polysilicon, etc. on an insulation substrate of large areas and thereby forming plural number of film transistors or the photoelectric conversion device having optical sensor composed of the said thin film transistor.

FIG. 1A is a schematic longitudinal sectional view of an example of the construction of the conventional thin film transistor.

Here, the gate insulation layer 2 is deposited on the gate electrode 1 and a film semiconductor layer 4 which becomes the channel, for example, hydrogenated amorphous silicon (hereinafter called a-Si:H) layer is provided thereon.

Further, n+ layer 6 is provided between the metal electrodes of source-drain electrodes 7 and 8 and by forming a junction which takes ohmic characteristics to electrons and blocking characteristics to the hole, the said n+ layer functions as n channel transistor. The surface of the thin film semiconductor 18 is at the upper plane of the channel section.

FIG. 1B is the plan view of FIG. 1A. FIG. 1B indicates in particular the thin film transistor having a planar type electrode construction (in FIG. 1B, electrodes 7 and 8 are comb type) which has been proposed for increasing channel length and solving the problem in the process.

The thin film transistor of FIGS. 1A and 1B may be utilized as the optical sensor of secondary photocurrent type. (For example, Japanese Patent Appln. Laid-Open No. 60-101940). Hereinafter such an optical sensor shall be called thin film transistor type optical sensor.

FIG. 2 is a schematic longitudinal sectional view of an example of the construction conventional co-planar type optical sensor which is a secondary photocurrent type sensor. An optical sensor indicated in FIG. 2 has substantially the same construction as the thin film transistor explained in FIG. 1 except that it has no gate electrode 1 and functions as the secondary photocurrent type optical sensor.

FIGS. 3A and 3B are the process drawings to show the manufacturing method of the conventional thin film transistor of FIG. 1.

The method of manufacture of such thin film transistor is disclosed, for example, in Japanese Patent Appln. Laid-Open No. 63-9157.

In FIG. 3A, G is a glass substrate and 1 is the Cr which forms gate electrode. After selectively forming gate electrode 1, silicon nitride film which becomes the gate insulation layer 2 is deposited for 3000 Å, a-Si:H4 which becomes thin film semiconductor layer 4 is deposited for 5000 Å and n+ layer 6 is continuously deposited for 1500 Å on the substrate by plasma CVD. Further, an aluminum layer which becomes source-drain electrodes 7 and 8 is deposited by sputtering etc. Thereafter, photosensitive resin 10 is coated all over the surface and it is exposed and patterned. FIG. 3B indicates the state after patterning of the aluminium which forms source-drain electrodes (i.e., the state after forming the source-drain electrodes 7 and 8). At this time, photosensitive resin 10 exists on the electrode. Using this photosensitive resin 10 as a mask, n+layer 6 is etched, for example, by RIE for the specified depth and thereafter photosensitive resin is peeled off. Then the thin film transistor is separated between devices and the thin film transistor shown in FIG. 1A is obtained.

The surface of the thin semiconductor film of the thin film transistor is easily affected by the atmosphere and if oxygen gas or steam is directly adsorbed or diffused to such surface, its electric characteristics greatly change because the semiconductor film is extremely thin. Because of that, studies are being made concerning the method to cover the surface of the device by a protective film made of silicon nitride (Si3N4) or aluminum oxide (A12O3) after the aforesaid process. (For example, Japanese Patent Appln. Laid-Open No. 59-61964).

A method is also proposed in which the polyimide resin film polymerized by heat treatment is used as the protective film.

Also, to give more stability, a proposal has been presented to form the second protective layer of the same material as that of film semiconductor 4 on the polymerized polyimide film. (For example, Japanese Patent Appln. Laid-Open No. 1-137674).

Generally speaking, a plural number of film transistors or a plural number of optical sensors which have been formed with thin film transistors are required to have uniform characteristics within the substrate even when it is large in area size. However, the thin film transistor or optical sensor formed in the step of FIGS. 3A and 3B tend to lack uniformity of electric characteristics when, for example, RIE (reactive ion etching) is employed particularly in the etching of the n+ layer of FIG. 3B. For example, when a large number of thin film transistors are formed on the substrate, the threshold voltage which determines the performance characteristics of thin films transistor produces a distribution of several volts in the substrate and it presents a serious obstacle in the use of the thin film transistor. As a result, the picture quality substantially changes in the case of active matrix type display. In the case of the optical sensor, the characteristics of photocurrent and dark current which are the basis characteristics of the sensor vary considerably from one optical sensor to another and it results in a serious deterioration of the quality of read-out image.

Especially when the protective film on the thin film transistor or optical sensor with non-uniform characteristics is made or organic material such as polyimide, there are occasions when environmental stability such as moisture resistance can not be expected.

On the other hand even when the protective film is made of inorganic material (for example, a-SiNx:H), the distribution of characteristics or undesirable electric characteristics as stated above may sometimes result, depending on the method of formation of the protective film taken or the composition of the formed protective film. It is also known from the report of Hiranaka et al. who have viewed the relation between the composition of insulation layer and film semiconductor layer 4, that there is the problem of gate interface of the thin film transistor. Hiranaka et al. suggest that the problem exists of gate interface between gate insulation film 2(SiNx:H) and the thin film semiconductor layer 4(a-Si:H) and the composition of the gate insulation film seriously influences the band conditions of film semiconductor layer 4 J. Appl. Phys. 62(5), P2129(1987) and J. Appl. Phys. 60(12), p4294(1986) }. Moisture resistance is also largely dependent upon the composition of insulation layer used as the protective film.

SUMMARY OF THE INVENTION

The present invention has been made in order to solve the aforesaid problems, and its object is to provide a thin film transistor wherein the problems raised by direct etching of the active semiconductor layer between electrodes by RIE etc., the process at the time of formation of the protective layer, variation of band conditions of active semiconductor layer depending on the composition of the protective layer and, ohmic characteristics between the active semiconductor layer, ohmic layer and metal electrodes, are solved. Also, the freedom of selection of the composition of the protective layer formed by inorganic materials increases, and a protective layer with preferred moisture resistance may be employed.

Another object of the present invention is to provide a thin film semiconductor wherein the characteristics of each thin film semiconductor (for example, electric characteristics) are subject to no scattering even when plural number of film semiconductor devices such as thin film transistors are formed on the substrate of a large area.

Still another object of the present invention is to provide a device of low cost, excellent electric characteristics with less scattering of characteristics within a substrate, and a high reliability in regard to environmental stability such as moisture resistance, for active matrix type display comprising a thin film transistor, a thin film transistor type optical sensor, co-planar type optical sensor etc. or photoelectric conversion device such as one-dimensional optical sensor array etc.

Still another object of the present invention is to provide the thin film semiconductor device obtained by laminating at least the active semiconductor layer, inactive semiconductor layer, ohmic layer and metal layer sequentially one after another on the substrate and forming the electrode with the ohmic layer and the metal layer.

Still another object of the present invention is to provide a thin film semiconductor obtained by laminating at least an active semiconductor layer, an inactive semiconductor layer and a protective layer sequentially one after another on a substrate and electrically connecting the active semiconductor layer with the ohmic layer and the metal layer which form electrodes through the contact hole provided at the said protective layer.

DETAILED DESCRIPTION OF THE PREFERRED EMBODIMENTS

To schematically describe the present invention, with the thin film semiconductor device of the present invention, it is possible to reduce the influence of etching such as RIE, the influence of the process of formation of protective film after forming the electrode and the influence of the composition of such protective film on the surface of the thin film semiconductor layer, by laminating at least an active semiconductor layer, an inactive semiconductor layer, a ohmic layer and a metal layer one after another on the substrate and forming the electrode by an ohmic layer and a metal layer.

In the present invention, the thin film semiconductor layer is composed of an active semiconductor layer and an inactive semiconductor layer and when the electrodes are formed by partially removing an ohmic layer and a metal layer, an inactive semiconductive layer is exposed between the electrodes.

Further, with the thin film semiconductor device of the present invention, it is possible to reduce the influence of etching such as RIE and the influence of the process of formation of the protective film after formation of electrodes and the influence of the composition of the protective film on the surface of the film semiconductor layer. This is done by laminating at least, an active semiconductor layer, an inactive semiconductor layer and a protective layer one after another on the substrate and electrically connecting the active semiconductor layer with the ohmic layer and the metal layer which form the electrodes through the contact hole formed at the protective layer.

Furthermore with the present invention, in the case when the thin film semiconductor layer is formed by the active semiconductor layer and the inactive semiconductor layer and electrodes are formed by partially removing the ohmic layer and metal layer, it is possible to achieve the aforesaid objective by exposing the inactive semiconductor layer between the electrodes, removing the inactive semiconductor layer and the protective layer at the connecting section and forming a contact hole, in order to obtain the preferred ohmic characteristics between the active semiconductor layer, the ohmic layer and the electrodes.

Now the embodiment of the present invention shall be described in detail with reference to the drawings.

EMBODIMENT 1

Figure 4A:
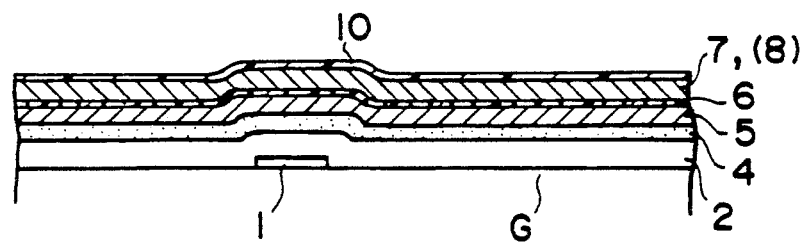
FIGS. 4A to 4C are the process drawings to show the method of preparation of a thin film transistor and a thin film transistor type optical sensor of the present invention.
Figure 4B:
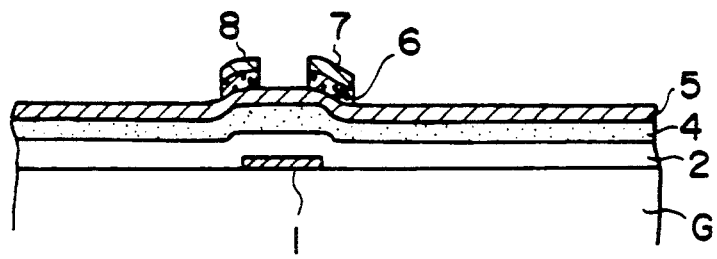
Figure 4C:
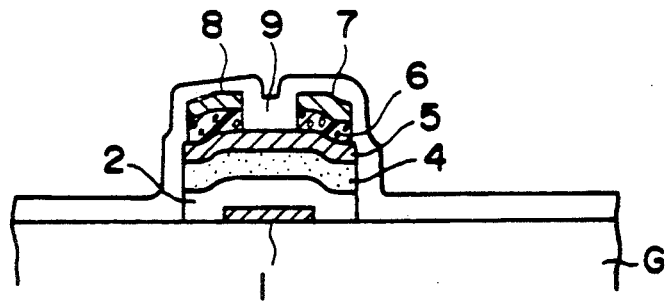

FIGS. 4A-4C are respectively the process drawings to show an example of the method of preparation of the thin film transistor and the thin film transistor type optical sensor of the present invention.

Hereunder is described an example of the manufacturing process of the thin film semiconductor device of the present invention with reference to the drawings.

First, after providing Cr on the basic insulation substrate G, a gate electrode 1 is selectively formed by photolithography etc., followed by deposition of 3000 Å hydrogenated amorphous silicon nitride film (hereinafter called a-SiNx:H) which becomes the gate insulation layer 2, 5000 Å of hydrogenated amorphous silicon (hereinafter called a-Si:H) which becomes the first thin film semiconductor layer 4 on the said gate insulation layer 2, about 700 Å of a-Si:H which becomes the second semiconductor layer 5 on the first thin film semiconductor layer 4 and 1500 Å of n+layer 6 which becomes the ohmic layer on the said second semiconductor layer 5, one after another by plasma CVD.

After the above, aluminum is deposited by sputtering for 1 μm and become the source-drain electrodes 7 and 8 on the said n+layer 6. This is followed by coating the photosensitive resist 10 in order to do patterning of the said source-drain electrodes 7 and 8 (FIG. 4A).

Then after patterning the photosensitive resist 10 to form the desired pattern, source-drain electrodes 7 and 8 are formed by wet etching using the photosensitive resist as the mask and, further, using the photosensitive resist 10 as the mask, n+layer 6 is removed by RIE. The range of such removal by etching is 1500 Å of n+ layer 6 and a part of the second semiconductor layer 5 which is the inactive semiconductor layer. Therefore, the first semiconductor layer 4 which is an active semiconductor layer is not etched and the first semiconductor layer 4 is protected by the second semiconductor layer 5 (FIG. 4B). The drawing shows the state after peeling off of the photosensitive resist 10.

Following the above, the photosensitive resist is coated (not shown in the drawing) and, after patterning, the devices are separated by RIE. That is, the gate insulation layer 2 between devices and the first and the second semiconductor layers 4 and 5 are respectively removed by etching and the photosensitive resist (not shown in the drawing) is peeled off. Succeeding thereto, polyimide (for example, LP52: made by Hitachi Chemical Co.) is coated by spinner as the protective film 9 and it is heat-treated (FIG. 4C).

As aforesaid, the thin film transistor or thin film transistor type optical sensor of the present embodiment are manufacture by the steps shown in FIGS. 4A-4C.

The deposition conditions of a-Si:H which is the first and the second semiconductor layer may be modified as desired. As an example, such conditions may be: flow rate of SiH4, 10 SCCM, pressure, 0.07 Torr, substrate temperature, 230° C. constant and discharge power is variable.

| Condition No. | 1 | 2 | 3 | 4 | 5 | 6 |
|---|---|---|---|---|---|---|
| SiH$_4$ (SCCM) | 10 | ← | ← | ← | ← | ← |
| Pressure (Torr) | 0.07 | ← | ← | ← | ← | ← |
| Substrate Temp. (°C.) | 230 | ← | ← | ← | ← | ← |
| Discharge power (W) | 4 | 8 | 3 | 5 | 8 | 120 |

Figure 5:
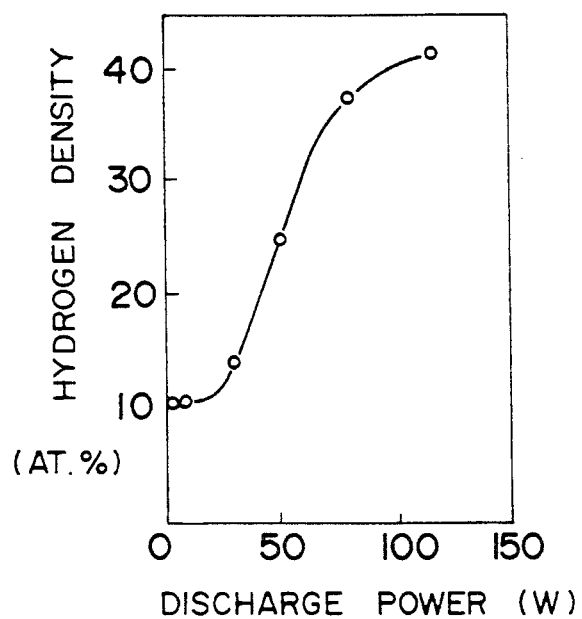
FIG. 5 is the characteristic drawing to show the hydrogen contact of deposition conditions of a-Si:H film as against discharge power.

FIG. 5 shows the hydrogen content as against discharge power of a-Si:H film prepared under the deposition conditions 1-6. When compared to the high quality active semiconductor layer having high photoconductive ration (1 and 2 of the aforesaid conditions), the inactive semiconductor layer is a semiconductor layer formed by deposition with relatively large discharge power and the photocurrent of deposited semiconductor layer takes the value one to two digits smaller than those of the high quality active semiconductor layer. As shown in FIG. 5, the hydrogen content of inactive semiconductor layer is larger than that of the active semiconductor layer. Detailed descriptions of this inactive semiconductor layer are given in the Japanese Patent Appln. Laid-Open Nos. 61-29170, 61-85859, 62-13274 and 62-13371.

In the present embodiment, among the aforesaid deposition conditions of a-Si:H, the condition 1 is employed for the first semiconductor layer which is an active semiconductor layer and condition 6 is employed for the second semiconductor layer which is an inactive semiconductor layer.

On the glass substrate of large area as shown in FIG. 3 (in the present embodiment, it is 300 mm □ are formed the film transistor of the present invention and the conventional film transistor provided with the same protective film (polyimide) as in the process of the present embodiment on the film transistor prepared by the conventional method (method of manufacture of FIG. 3) at the pitch of about 20 mm.

Figure 6:
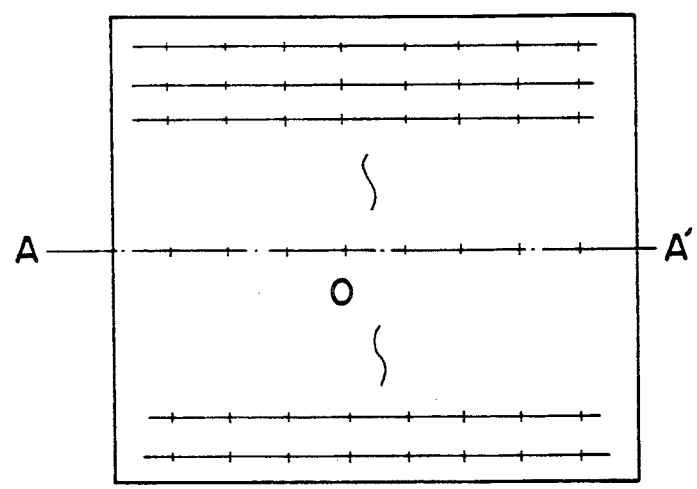
FIG. 6 is an explanatory drawing to show the position where a semiconductor device is formed in the glass substrate of a large area.

In FIG. 6, Cross + indicates a part of the preparing position of the film transistor. Zero point is roughly at the center of the substrate.

Figure 7:
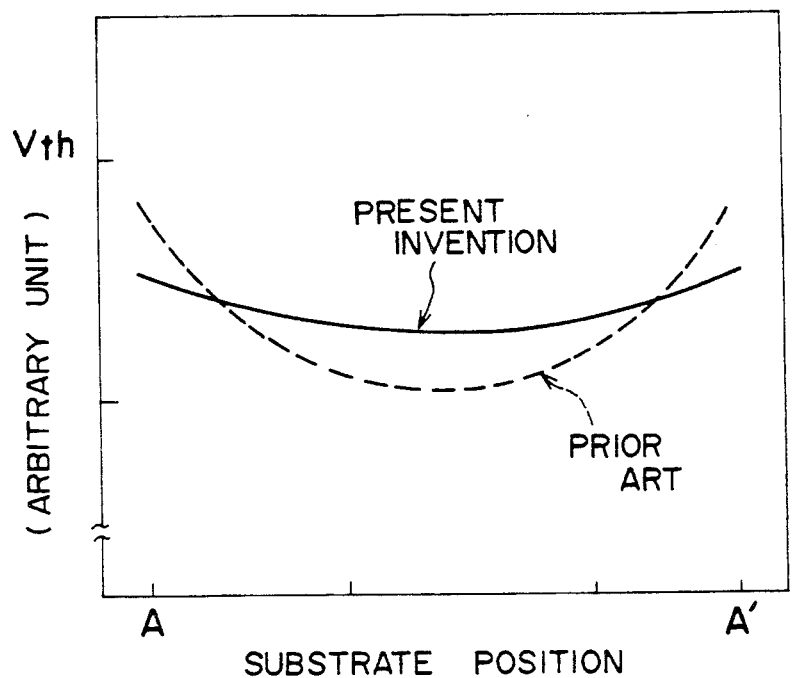
FIG. 7 is the characteristic drawing to show the distribution of threshold voltage of the dark current of a thin film transistor along line A—A' of FIG. 6.

FIG. 7 is the characteristic drawing to show the distribution of threshold voltage Vth of the dark current of film transistor along line A—A' of FIG. 6.

As it is evident from FIG. 7, the value of threshold voltage Vth between transistors of the film transistor of the present invention is subject to less fluctuation and thus it demonstrates improved performance when compared to the thin film transistor of the conventional method. Here, though not indicated in the drawing, it goes without saying that the characteristics of the film transistor, dark current etc. are same.

As aforesaid, it is know that according to the present invention, only a part of the second semiconductor layer which is an inactive semiconductor layer is etched by RIE and the first semiconductor layer which is an active semiconductor layer is not etched and thus the influence on the characteristics of the film transistor is reduced and preferred characteristics are obtained uniformly for the entire area of the large area substrate.

In the present embodiment, deposition condition 6 are employed for a-Si:H film in the case of inactive semiconductor layer but as far as hydrogen content of a-Si:H film is over 20% and its forbidden band width is expanded by more than 0.1-0.2 eV, a similar effect is obtained.

When the thin film transistor type optical sensor is prepared with the similar construction and in the same manner as those of the thin film transistor the distribution of the dark current of the thin film transistor corresponds to the characteristics shown in FIG. 7 and the distribution of Ip of the optical sensor made of it is also improved just as in the case of the dark current.

EMBODIMENT 2

Method of preparation of the thin film transistor and the thin film transistor type optical sensor of the second embodiment is described in reference to FIG. 4 referred to in the method of preparation of the embodiment 1 to obtain moisture resistance higher than that of embodiment 1.

The process up to separation between devices and peeling off of resist for separation between devices of FIGS. 4A–4C is the same as that of embodiment 1. Embodiment 2 differs from embodiment 1 in that the protective film 9 formed thereafter is a-SiNx:H film formed by plasma CVD. In the present embodiment, a-SiNx:H film is deposited for 3000 Å as protective film 9 and thus a thin film transistor and a thin film transistor type optical sensor are formed.

Below are given the deposition conditions of a-SiNx:H film Which is the protective film.

| | |
|---|---|
| SiH4 (SCCM) | 10 |
| NH3 (SCCM) | 280 |
| H2 (SCCM) | 90 |
| Pressure (Torr) | 0.2 |
| Discharge power (W) | 30 |
| Substrate temp. (°C.) | 230 |

In the case of the film transistor of embodiment 2, the first semiconductor layer 4 which is an active semiconductor layer is protected by the second semiconductor layer 5 which is an inactive semiconductor layer as in the case of the embodiment 1 and thus the active semiconductor layer is influenced less by the RIE and also the influence of film forming at the deposition of protective film 9 and the influence of composition of the protective film upon the characteristics of the transistor is also less. Additionally, as in the case of embodiment 1 shown in FIG. 7, the distribution of threshold voltage Vth of dark current over the substrate of large area is improved and preferred characteristics are obtained.

Figure 1A:
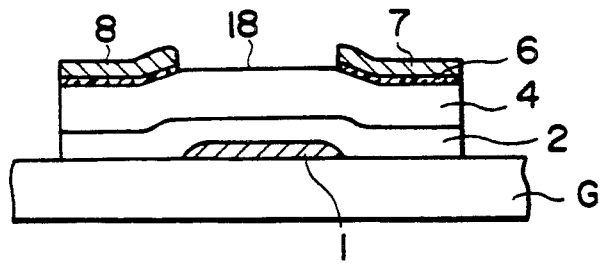
FIG. 1A is a typical longitudinal 7 sectional view of thin film transistor.
Figure 3A:
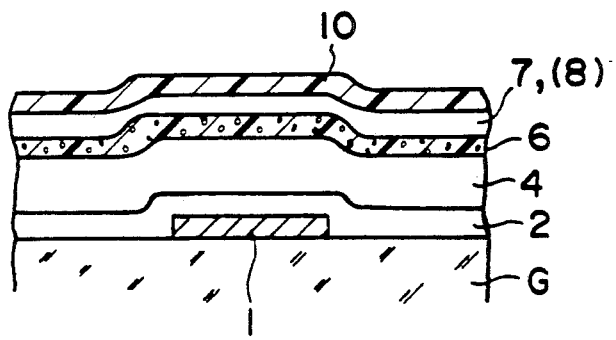
FIGS. 3A and 3B are the process drawings to show the method of preparation of a thin film transistor.
Figure 3B:
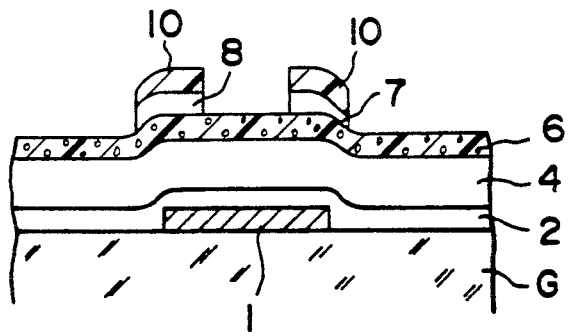

In order to evaluate the environmental stability, particularly the moisture resistance of the film transistor of the present invention, a shelf test at high temperature and high humidity (for example shelf test at 60° C., 90%) has been conducted on the thin film transistor (A) which has been prepared by forming the same protective film by the same process as that of embodiment 1 on the conventional thin film transistor of FIG. 1A and deposited by the process of FIGS. 3A and 3B on the substrate of FIG. 6, and the thin film transistor (B) of the present invention prepared in embodiment 1 and the thin film transistor at point 0 along the line A—A' of FIG. 6 of the thin film transistor (C) prepared in the present embodiment.

Figure 8:
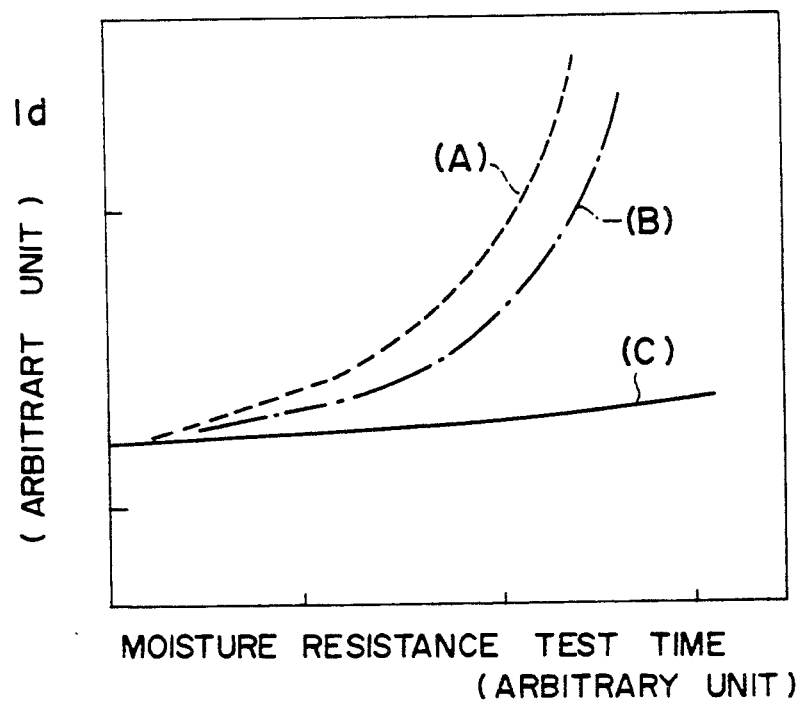
FIG. 8 is the characteristic drawing to show an example of the result of 90% moisture resistance test at 60° C. on a thin film transistor.

FIG. 8 is the characteristic drawing to show an example of the results of such shelf test at high temperature and humidity.

The said figure monitors, as the index of moisture resistance, the dark current Id at drain voltage Vd=10V and gate voltage Vg=0V for each film transistor and plots the change of the measured values with the length of shelf time.

As it is evident in FIG. 8, the increase of dark current is larger by the order of (A)> (B)>(C), indicating that the entry of moisture is suppressed by the present invention. In other words, it is known that by providing the second semiconductor which is an inactive semiconductor, moisture resistance is obtained, and further, by providing a protective film with high moisture resistance, improvement of moisture resistance is obtained without deteriorating the initial characteristics.

EMBODIMENT 3

Figure 9:
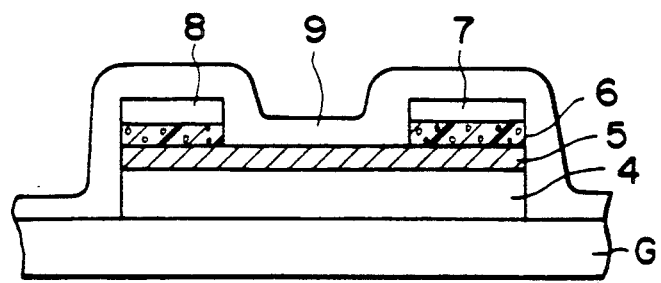
FIG. 9 is the typical longitudinal sectional view of co-planar type sensor of embodiment 3.

FIG. 9 is the schematic longitudinal section view to indicate the optical sensor of planar type manufactured by the present invention. The method of preparation is the same as those of the embodiments 1 and 2 except that electrode 1 and gate insulation layer 2 are not provided in this case.

Figure 10:
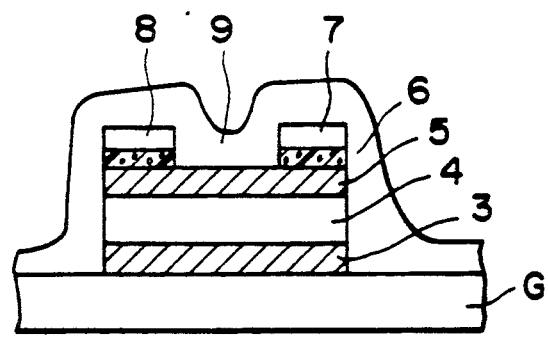
FIG. 10 is the typical longitudinal view of a co-planar sensor wherein an inactive semiconductor layer is also provided on the substrate.

As shown in FIG. 10, it is also possible to provide an inactive semiconductor layer 3 which is the same as the second semiconductor layer 5 in embodiments 1 and 2 on the substrate.

The same evaluation as those made for embodiments 1 and 2 has also been made with the optical sensor prepared by the present embodiment and it was found that the uniformity of characteristics such as dark current on the substrate of large area is good and a similar effect was obtained as well for moisture resistance.

EMBODIMENT 4

The embodiment 4 of the present invention has been prepared as the one-dimensional sensor array of the image read-out device of facsimile etc., by forming the driving circuit composed of the optical sensor and the film transistor of the present invention on the same substrate by the similar process to that employed for embodiment 2.

Figure 11:
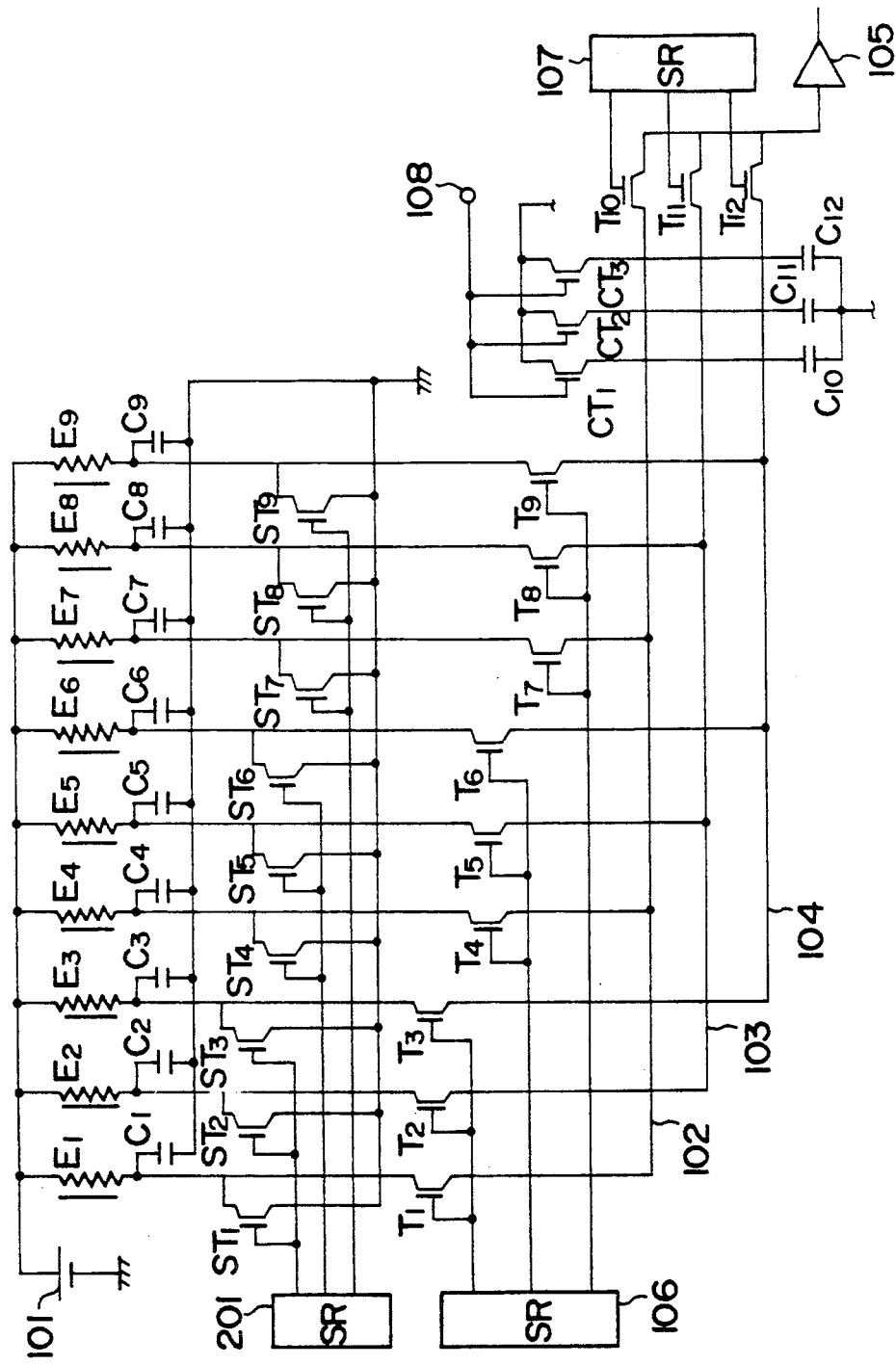
FIG. 11 is a circuit composition drawing to show an example of the circuit of an image read-out device.

FIG. 11 shows the circuit composition of an example of one-dimensional sensor array composed of the film transistor type optical sensor and film transistor of the present invention.

Here, the case of the sensor array having 9 optical sensors shall be described. In the Figure, three each of the optical sensors E1-E9 compose one block and three blocks compose an optical sensor array. The same applies to the condensers C1-C9 and switching transistors T1-T9, which correspond to optical sensors E1-E9.

Individual electrodes which are numbered in the same order in each block of optical sensors E1-E9 are connected to one of the common lines 102-104 via switching transistors T1-T9.

To be more specific, the first switching transistors T1, T4, and T7 of each block are connected to the common line 102, the second switching transistors T2, T5 and T8 of each block are connected to the common line 103 and the third switching transistors T3, T6 and T9 of each block are connected to the common line 104. The common lines 102-104 are connected to the amplifier 105 via the switching transistors T10-T12.

The gate electrodes of switching transistors ST1-ST9 are commonly connected block by block as in the case of the gate electrodes of switching transistors T1-T9 and they are connected to the parallel output terminal of shift register 201 block by block. Therefore according to the shift timing of the shift register 201, the switching transistors ST1-ST9 become ON one after another block by block.

In FIG. 11, common lines 102-104 are left free via the respective condensers C10-C12 and they are grounded via the switching transistors CT1-CT3.

The capacities of condensers C10-C12 are made sufficiently larger than the capacities of condensers C1-C9. Gate electrodes of switching transistors CT1-CT3 are commonly connected to terminal 108. When high level is impressed on terminal 108, switching transistors CT1-CT3 are simultaneously become ON and common lines 102-104 are grounded.

Figure 12:
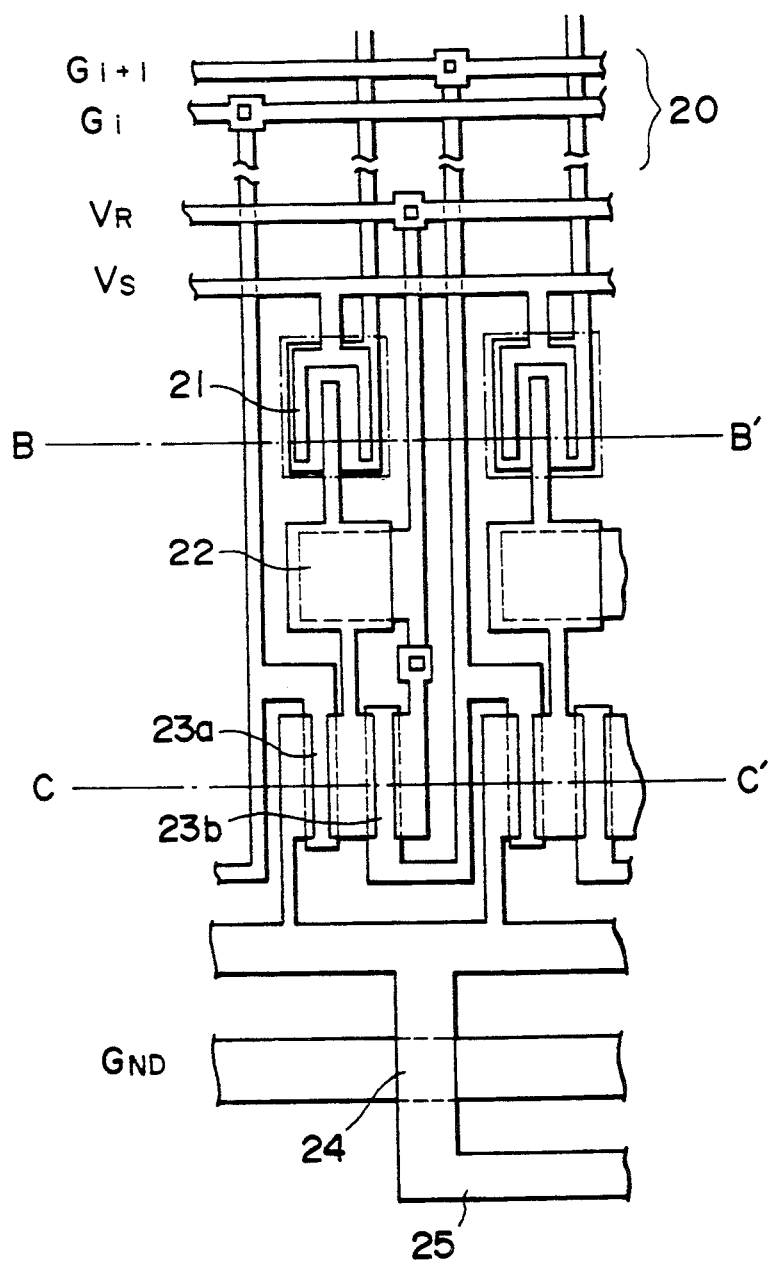
FIG. 12 is a typical partial plan view of a one-dimensional sensor array prepared based on the circuit shown in FIG. 11.

FIG. 12 indicates the partial plan view of one-dimensional sensor array prepared based on the circuit diagram shown in FIG. 11.

In the diagram, 20 is the wiring formed in the matrix, 21 is the optical sensor section which uses the thin film transistor type optical sensor according to the present invention, 22 is the electric charge accumulating section, 23a is the transfer switch which employs the film transistor of the present invention, 24b is the switch for electric discharge employing film transistor of the present invention, which resets the electric charge of the electric charge accumulating section 22, 25 is the lead-out line to connect the signal output of transfer switch to signal processing IC and 24 is the load-condenser to accumulate and read the electric charge transferred by transfer switch 23a.

In FIG. 12, to avoid complication, only two layers of electrode wiring above and below are shown and the aforesaid photoconductive semiconductor layer and insulation layer are not shown in the drawing. At the boundary of the upper layer electrode wiring and the semiconductor layer is formed a n+ layer 39 (indicated in FIGS. 13A and 13B) and an ohmic junction is formed.

Figure 13A:
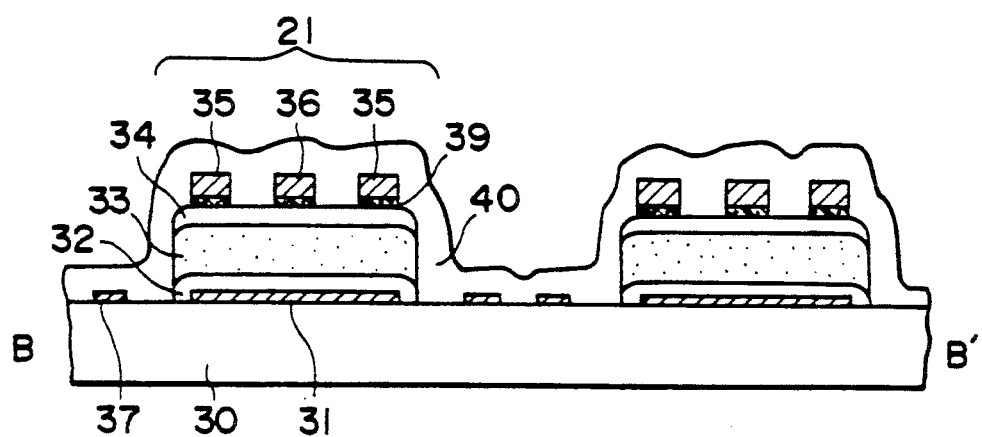
FIGS. 13A and 13B are the typical partial sectional views of a one-dimensional sensor array prepared on the basis of the circuit shown in FIG.

FIG. 13A indicates the vertical sectional view of optical sensor section 21 and optical sensor section 21 is composed of the wiring of the lower electrode 31 which is a gate electrode, insulation layer 32 which is a gate insulation layer, an active semiconductor layer 33, an inactive semiconductor layer 34, wiring of the upper electrode 36 which is the source electrode, wiring of the upper electrode 35 which is drain electrode and protective layer 40. At the surface of the active semiconductor layer between the source and drain electrodes is provided an inactive semiconductor layer as in the case of the second embodiment.

Figure 13B:
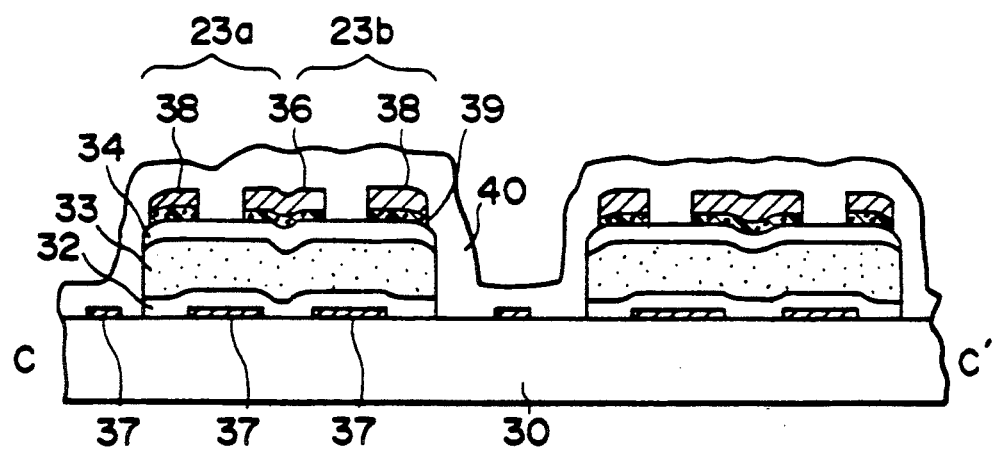

FIG. 13B indicates the longitudinal sectional view of transfer switch 23a and discharge switch 23b, the transfer switch 23a being composed of the wiring of the lower electrode 37 which is the gate electrode, the insulation layer 32 which is the gate insulation layer, the active semiconductor layer 33, the inactive semiconductor layer 34, wiring of the upper electrode 36 which is the source electrode, wiring of the upper electrode 38 which is the drain electrode and the protective film 40. The discharge switch 23b has the construction similar to that of the transfer switch 23a.

As for the transfer switch 23a and discharge switch 23b, the inactive semiconductor layer is provided at the surface of the active semiconductor layer between the source and drain electrodes as in the case of the aforesaid optical sensor section.

As aforesaid, an ohmic contract layer 39 if formed at the boundaries of optical sensor section, the upper electrode wiring 35, 36 and 38 of the transfer switch and discharge switch and the inactive semiconductor layer 34.

Similarly, with the embodiment 2, the one-dimensional sensor array formed on the substrate of large area according to the present invention is so constructed that the active semiconductor layer 33 is protected by the inactive semiconductor layer 34. The influence of removal of ohmic contact layer 39 by etching at the time of forming of electrodes of optical sensor and transfer discharge switches, the influence of the process of formation of the protective layer after formation of the electrodes and the influence of the composition of such protective layer on the thin film transistor are reduced and thus a preferred characteristic and a high reliability are obtained uniformly on the entire surface of the substrate of large area.

Figure 14:
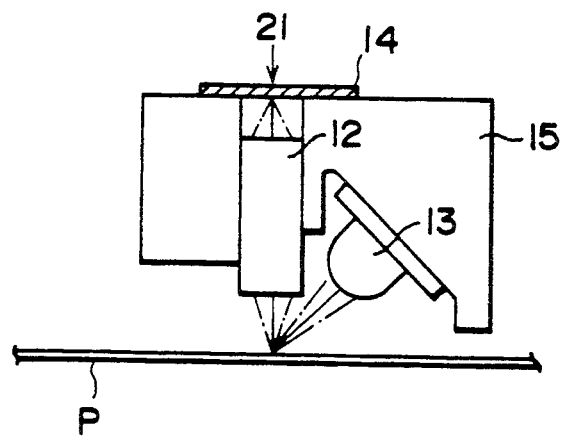
FIG. 14 is the explanatory drawing showing an example of an image read-out device with the lens of the present invention.
Figure 15:
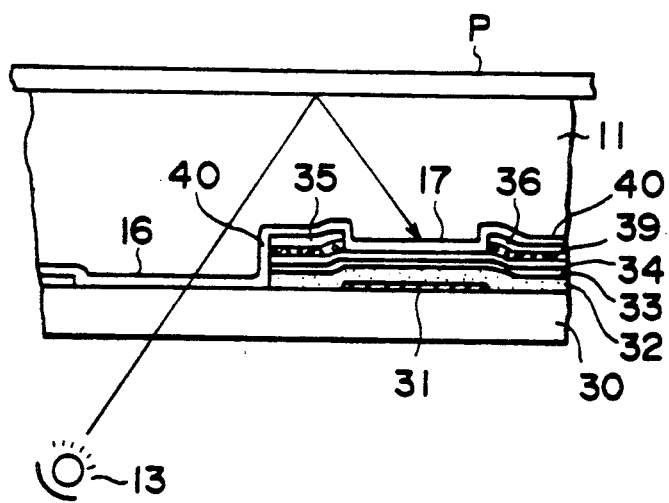
FIG. 15 is the explanatory drawing to show an example of a lens-less image read-out device of the present invention.

Furthermore, the one-dimensional sensor array of the present invention may be applied either to the image reading device with lens which focuses the image of manuscript on the optical sensor section using the equi-multiple image forming lens 12 (for example, Selfoc lens made by Nippon Sheet Glass Co.) as shown in FIG. 14 or the lens-less image reading device wherein a wear-resistant layer 11 is formed at the upper part of the optical sensor shown in FIG. 15 and the manuscript P is read by irradiating light from behind the sensor by the light source 13.

In FIG. 14, 14 is the sensor array substrate and 15 is the casing. In FIG. 15, 16 is the window for injection of light and 17 is the photoelectric converter. Other constituent members in FIG. 15 are the same as those indicated in FIGS. 12, 13A and 13B and therefore, the same signs are given to the respective members and their explanations are omitted.

EMBODIMENT 5

FIG. 16 is the process drawing to show an example of the manufacturing method of the thin film transistor and the thin film transistor type optical sensor of the present invention.

Figure 16A:
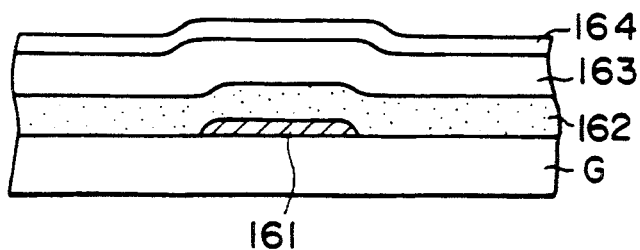
FIGS. 16A–16F are the process drawings to show the method of preparation of the thin film transistor and the thin film transistor type optical sensor of the present invention.
Figure 16B:
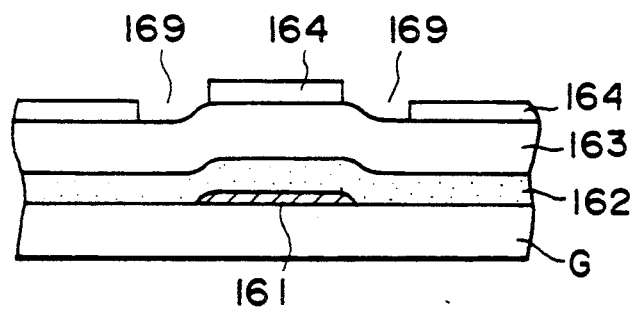

First, Cr is provided on the insulating substrate G which is the base and electrode 161 is selectively formed by etching Cr into the desired shape by photolithographic process etc. followed by deposition of 3000 Å of hydrogenated amorphous silicon nitride film (hereinafter called a-SiNx:H) which becomes the gate insulation layer 162, 5000 Å of hydrogenated amorphous silicon (hereinafter called a-Si:H) which becomes the first film transistor layer 163 formed on the gate insulation layer 162 and about 700 Å of a a-Si:H which becomes the second semiconductor layer 164 formed on the first film semiconductor layer 163, one after another by plasma CVD (FIG. 16a). Succeeding thereto, the photosensitive resist, not shown in the drawing, (for example OFPR 800—manufactured by Tokyo Ohka Kogyo Co., Ltd.) is coated by spinner, patterned into the desired pattern, the second semiconductor layer 164 which is an inactive semiconductor is removed by RIE in order to form the n+ layer and source-drain electrodes on the first semiconductor layer 163 which is an active semiconductor layer, using the patterned photosensitive resist as the mask, thus forming the contact hole 169, followed by removal of photosensitive resist (FIG. 16B).

Figure 16C:
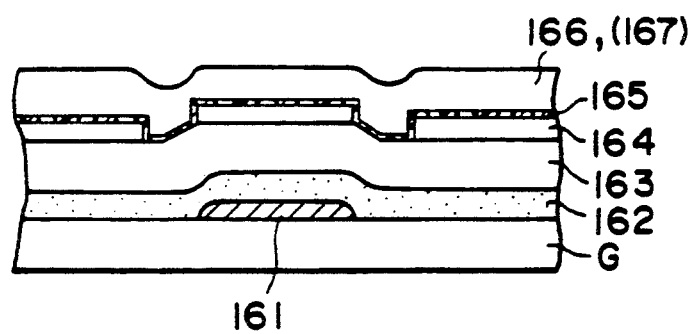

Following thereto, n+ layer 165 is deposited for 1500 Å by plasma CVD and aluminum which becomes the source-drain electrodes 166 and 167 are deposited for 1 μm by sputtering (FIG. 16C).

Thereafter the photosensitive resist for patterning of the source-drain electrode is coated (not shown in the drawing). The resist is patterned into the desired pattern, the source-drain electrodes 166 and 167 are formed by wet etching using the patterned photosensitive resist as the mask and n+ layer 165 is removed by RIE. The range (area) to be removed by etching is 1500 Å of n+ layer and a part of the second semiconductor layer 164 which is an inactive a-Si:H film semiconductor layer.

Therefore, the first semiconductor layer 163 which is an active semiconductor layer is not etched and the first semiconductor layer 163 is protected by the second semiconductor layer 164. FIG. 16E shows the state after removal of the photosensitive resist.

Thereafter, the photosensitive resist is coated (not shown in the drawing) and after patterning the photosensitive resist into the desired pattern, the gate insulation layer 162 between devices and the first and second semiconductor layers 163 and 164 are removed by RIE to separate devices and the photosensitive resist is removed (FIG. 16E).

Figure 16D:
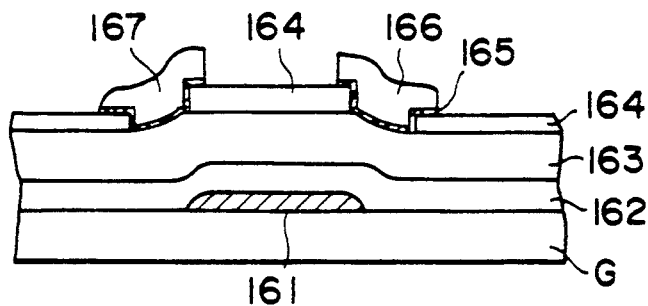
Figure 16E:
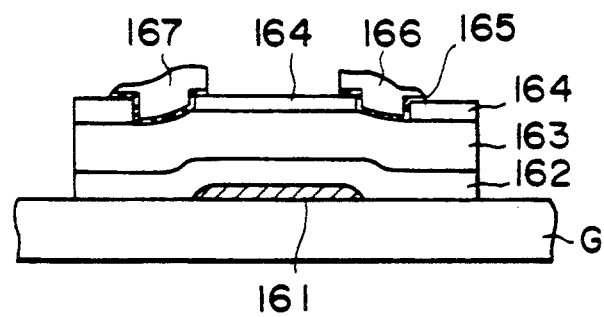
Figure 16F:
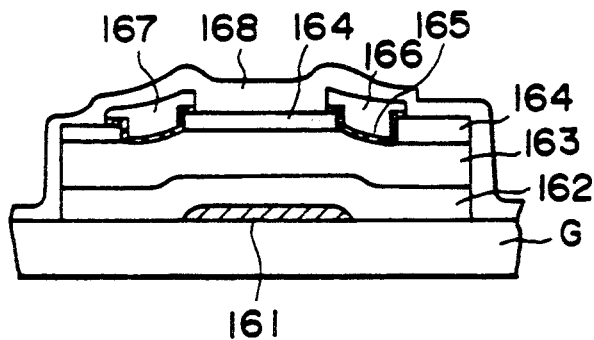

Following thereto, polyimide (for example, LP52: manufactured by Hitachi Chemical Co., Ltd.) is coated by spinner as the protective film 16 and it is heat-treated (FIG. 16F).

As aforesaid, the thin film transistor and the thin film transistor type optical sensor of the present embodiment are prepared according to FIGS. 16A-16E.

In the present embodiment, among the deposition conditions of the aforesaid a-Si:H, the deposition condition 1 is used for deposition of the first semiconductor layer and deposition condition 6 is used for deposition of the second semiconductor layer.

Figure 1B:
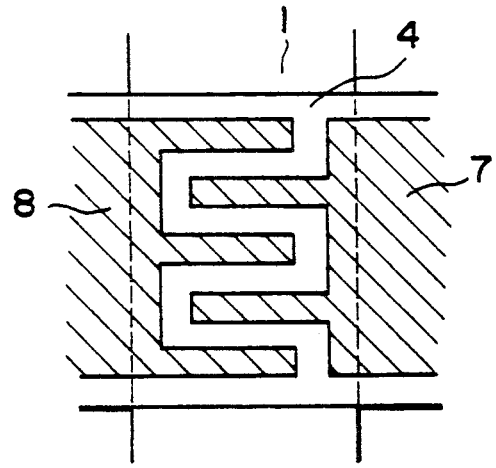
FIG. 1B is the typical plan view of a thin film transistor.
Figure 2:
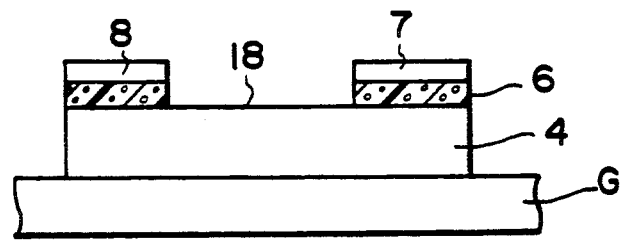
FIG. 2 is the typical longitudinal sectional view of a co-planar type sensor.

As aforesaid, the thin film transistor of the present invention and the conventional film transistor (indicated in FIG. 1) prepared by the conventional method (method shown in FIG. 3) is provided with the same protective film (polyimide) by the same process as employed for the present embodiment are formed on glass substrate of large area (399 mm □) as shown in FIG. 6, at the pitch of about 20 mm.

Figure 17:
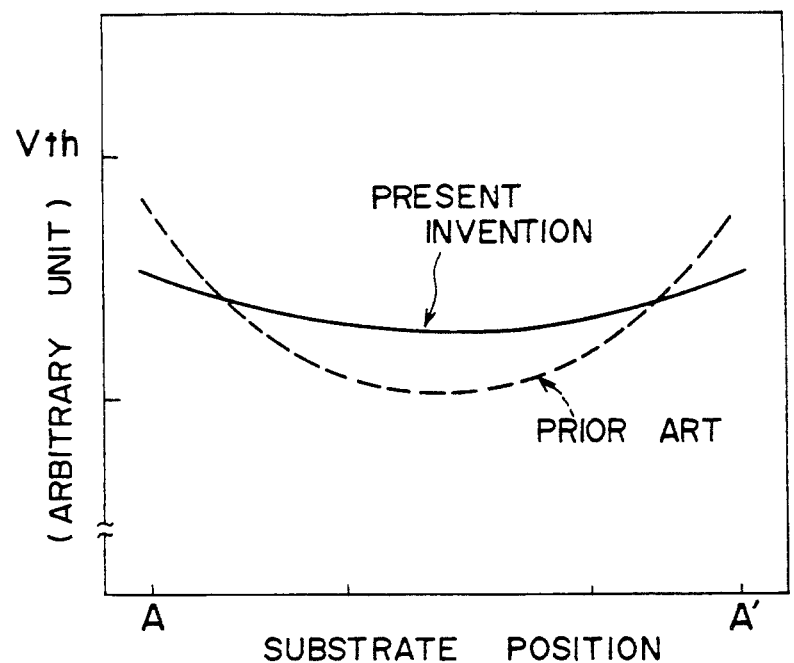
FIG. 17 is the characteristic drawing to show the threshold voltage of the dark current of the thin film transistor along with line A—A' of FIG. 6.

FIG. 17 is the characteristic drawing to show the distribution of threshold voltage Vth of the dark current of the film transistor along the line A-A' of FIG. 6.

As is evident in FIG. 17, when compared to the film transistor made by the conventional method, the difference in the value of threshold voltage Vth between transistors is improved in the case of the present invention. It goes without saying that the characteristics and the dark current etc. of the film transistor of the present invention are also similarly improved, though not shown in the drawing.

According to the present invention, only a part of the second semiconductor layer which is an inactive semiconductor layer is etched by RIE while the first semiconductor layer which is the active semiconductor layer is not etched, and as a result, the influence on the characteristics of the film transistor is reduced and uniform characteristics are obtained for the substrate of large area.

Furthermore, after forming the contact hole at the second semiconductor layer which is an inactive semiconductor layer, the n+ layer and source-drain electrodes are deposited, and as a result an ohmic contact is formed with the first semiconductor layer which is an active semiconductor layer and preferred ohmic characteristics are obtained.

In the present embodiment, an inactive semiconductor layer is formed with a-Si:H film under deposition condition 6, but as far as the hydrogen content of a-Si:H film is over 20% and its forbidden band width is expanded by more than 0.1-0.2 eV, a similar effect is obtained.

When the thin film transistor type optical sensor is prepared with the same construction and by the same method as those for the aforesaid thin film transistor, the distribution of dark current of the thin film transistor has similar characteristics as those shown in FIG. 17 and when it is made into an optical sensor, the distribution of Ip is also improved as in the case of dark current.

EMBODIMENT 6

Method of preparation of film transistor and film transistor type optical sensor described in embodiment 6 is explained in reference to FIG. 16 which has been used in the explanation of the method of preparation of embodiment 5, in order to secure better moisture resistance.

The steps up to the separation of devices and removal of the resist for separation of devices illustrated in FIGS. 16A-16E are the same as those of embodiment 5. The different step from embodiment 5 is that the protective film 168 formed after separation of devices is made of a-SiNx:H film obtained by plasma CVD. This a-SiNx:H film is deposited for 3000 Å to prepare the thin film transistor and the thin film transistor type optical sensor of the present embodiment.

Below are shown the deposition conditions of a-SiNx:H film which is the protective film 168.

| | |
|---|---|
| SiH4 (SCCM) | 10 |
| NH3 (SCCM) | 280 |
| H2 (SCCM) | 90 |
| Pressure (Torr) | 0.2 |
| Discharge power (W) | 30 |
| Substrate temperature (°C.) | 230 |

In the case of the thin film transistor of the present embodiment, the first semiconductor layer 163 which is an active semiconductor layer is protected by the second semiconductor layer which is an inactive semiconductor layer 164 as in the case of embodiment 1 and the influence of RIE one the active semiconductor layer and the influence of the process of formation and the composition of the protective film 168 on the characteristics of such active semiconductor layer are reduced and as a result, a preferred characteristics with improved distribution of threshold voltage Vth of dark current is obtained with the substrate of large area. Also, a preferred ohmic characteristics is obtained.

In order to evaluate the environmental stability, particularly the moisture resistance, of the thin film transistor of the present invention, a high temperature high humidity shelf test (for example at 60° C. and 90) was conducted on the thin film transistor A prepared by forming the same protective film by the same process as those of embodiment 5 on the conventional film transistor shown in FIG. 1A which has been prepared with the substrate of FIG. 6 by the method shown in FIGS. 3A and 3B, the thin film transistor B of the present invention prepared in embodiment 5 and the thin film transistor at point 0 along the line A—A' of FIG. 6 of the film transistor (C) of the present invention prepared in the present embodiment.

Figure 18:
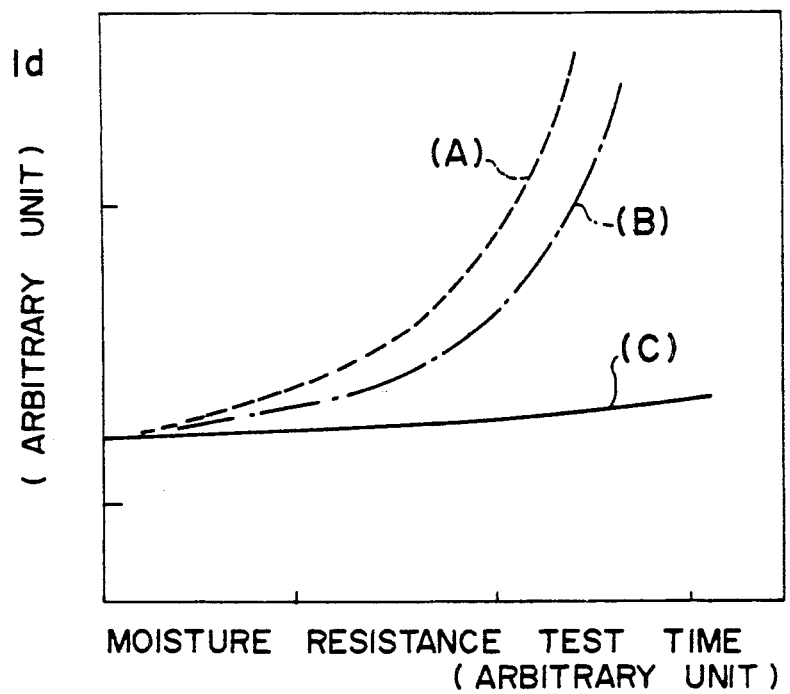
FIG. 18 is the characteristic drawing to show an example of the results of moisture 5 resistance test of a thin film transistor at 90% humidity at 60° C.

FIG. 18 is the characteristic drawing of an example of the results of such shelf test at high temperature and high humidity. The drawing monitors, as the index of moisture resistance, the dark current Id at drain voltage Vd=10V and gate voltage Vg=0V of each film transistor and plots the change of values according to the time on the shelf.

As is evident from FIG. 18, the increase of dark current is larger by the order of (A)>(B)> (C), which indicates that the infiltration of water is inhibited by the method of the present invention. By providing the second semiconductor layer 164 which is an inactive semiconductor layer, moisture resistance is improved and further by providing a protective film which gives high moisture resistance, even greater improvement of moisture resistance is obtained without deteriorating the initial characteristics.

When the thin film transistor type optical sensor is prepared with the similar construction and by the similar method of manufacture to those of the thin film transistor, the distribution of threshold voltage Vth of the dark current is improved as is shown by the characteristic drawing of FIG. 17. Furthermore, moisture resistance is improved without damaging the initial characteristics.

EMBODIMENT 7

FIG. 19 is the process drawing to show the method of preparation of film transistor and film transistor type optical sensor of the embodiment 7 of the present invention.

FIG. 19A-19E are substantially the same as FIGS. 16A-16E of the embodiments 1 and 2. Therefore, only the different points are briefly described below.

Figure 19A:
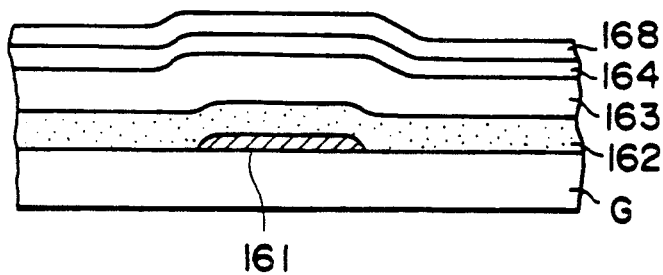
FIGS. 19A–19E are the process drawings to show the method of manufacture of embodiment 7.

FIG. 19A, unlike the case of the embodiments 1 and 2, after deposition of the second semiconductor layer 164 which is an inactive semiconductor layer, deposition by plasma CVD is continued up to the formation of a-SiNx:H film which becomes the protective film 168.

The conditions of deposition of the protective film 168 in the present embodiment are the same as the deposition conditions of the protective film of the embodiment 6.

At the time of deposition of the protective film 168, the first semiconductor layer 163 which is an active semiconductor layer is protected by the second semiconductor layer 164 which is an inactive semiconductor layer.

Figure 19B:
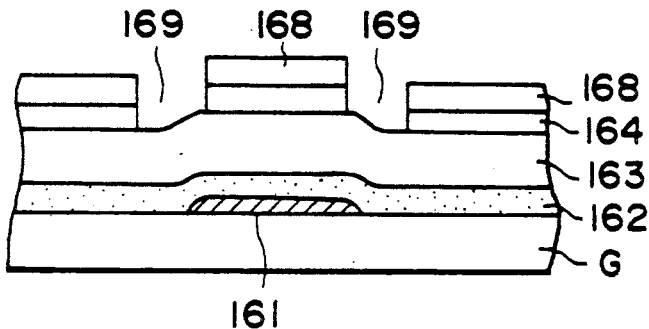

Succeeding thereto, as in the case of the embodiments 5 and 6 the photosensitive resist (not shown in the drawing) is coated by spinner, patterned into the desired pattern and protective film 168 and the second semiconductor layer 164 which is an inactive semiconductor layer are continuously removed by RIE in order to form n+layer and source-drain electrodes on the first semiconductor layer 163 which is an active semiconductor layer, using the said photosensitive resist as the mask as shown in FIG. 19B, followed by formation of contact hole 169 and removal of photosensitive resist.

Figure 19C:
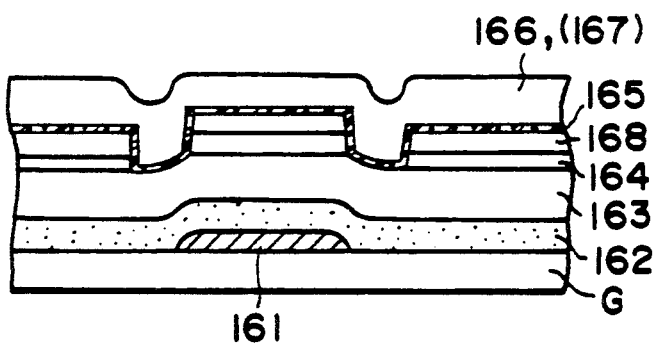
Figure 19D:
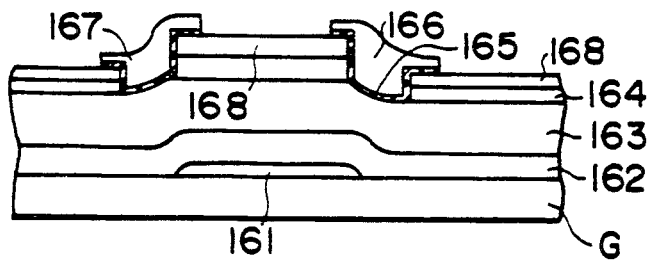
Figure 19E:
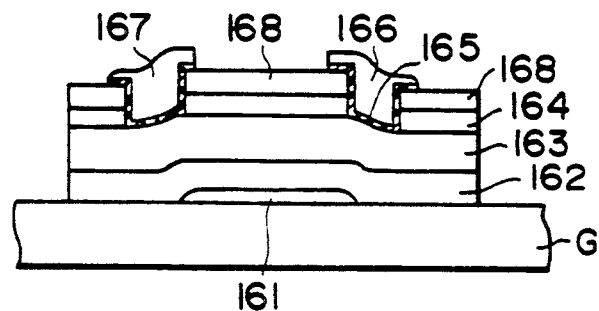

The steps shown in FIGS. 19C-19E are same as those shown in FIGS. 16C-16E of the embodiments 5 and 6 and according to such steps, the thin film transistor and the thin film transistor type optical sensor of the present embodiment have been prepared.

In the present embodiment, at the time of formation of contact hole shown in FIG. 19B, the first and the second semiconductor layers are protected by the protective film and furthermore the influence of RIE on the characteristics of the active semiconductor layer is reduced, while as n the case of the embodiment 1 and 2, at the time of deposition of the protective film, the active semiconductor layer is protected by the inactive semiconductor layer and thus the influence of formation process and the composition of protective film on the characteristics thereof is reduced and the evaluation similar to that made for the embodiment 2 revealed the preferred distribution of the initial characteristics, ohmic characteristics and moisture resistance for the substrate of large area.

EMBODIMENT 8

Figure 20:
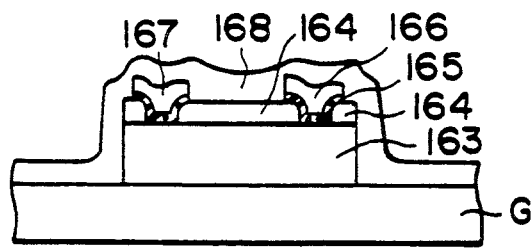
FIG. 20 is the typical longitudinal sectional view of co-planar type sensor prepared by the method described in embodiments 5 and 6.
Figure 21:
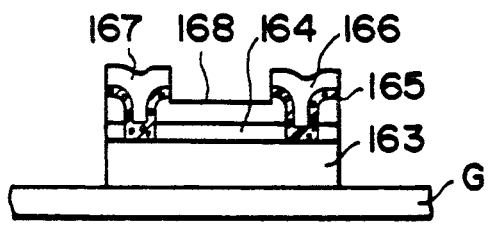
FIG. 21 is the typical longitudinal sectional view of co-planar type sensor prepared by the method described in embodiment 7.

FIGS. 20 and 21 indicate the typical longitudinal sectional view of co-planar type optical sensor prepared according to the present invention. The method of preparation of such optical sensor is the same as those of embodiments 5, 6 and 7 except that the gate electrode 161 and the gate insulation layer 162 are not formed. FIG. 20 is the co-planar type optical sensor prepared according to the embodiments 5 and 6 while FIG. 21 shows the co-planar type optical sensor prepared in the embodiment 7.

It is also possible to provide on the substrate, the same inactive semiconductor layer as the second semiconductor layer 164 of the embodiments 5, 6 and 7.

The optical sensor prepared by the present embodiment was evaluated substantially in the same way as for the embodiments 5 and 6 and it was revealed that the characteristics of dark current etc. and ohmic characteristics were uniform over the substrate of large area and a similar effect was obtained as well as to moisture resistance.

EMBODIMENT 9

In the embodiment 9 of the present invention, the optical sensor of the present invention and the driving circuit comprising the thin film transistor were formed simultaneously on the same substrate by the process similar to that of embodiment 7, as the one-dimensional sensor array of the image reading device such as facsimile.

Figure 22:
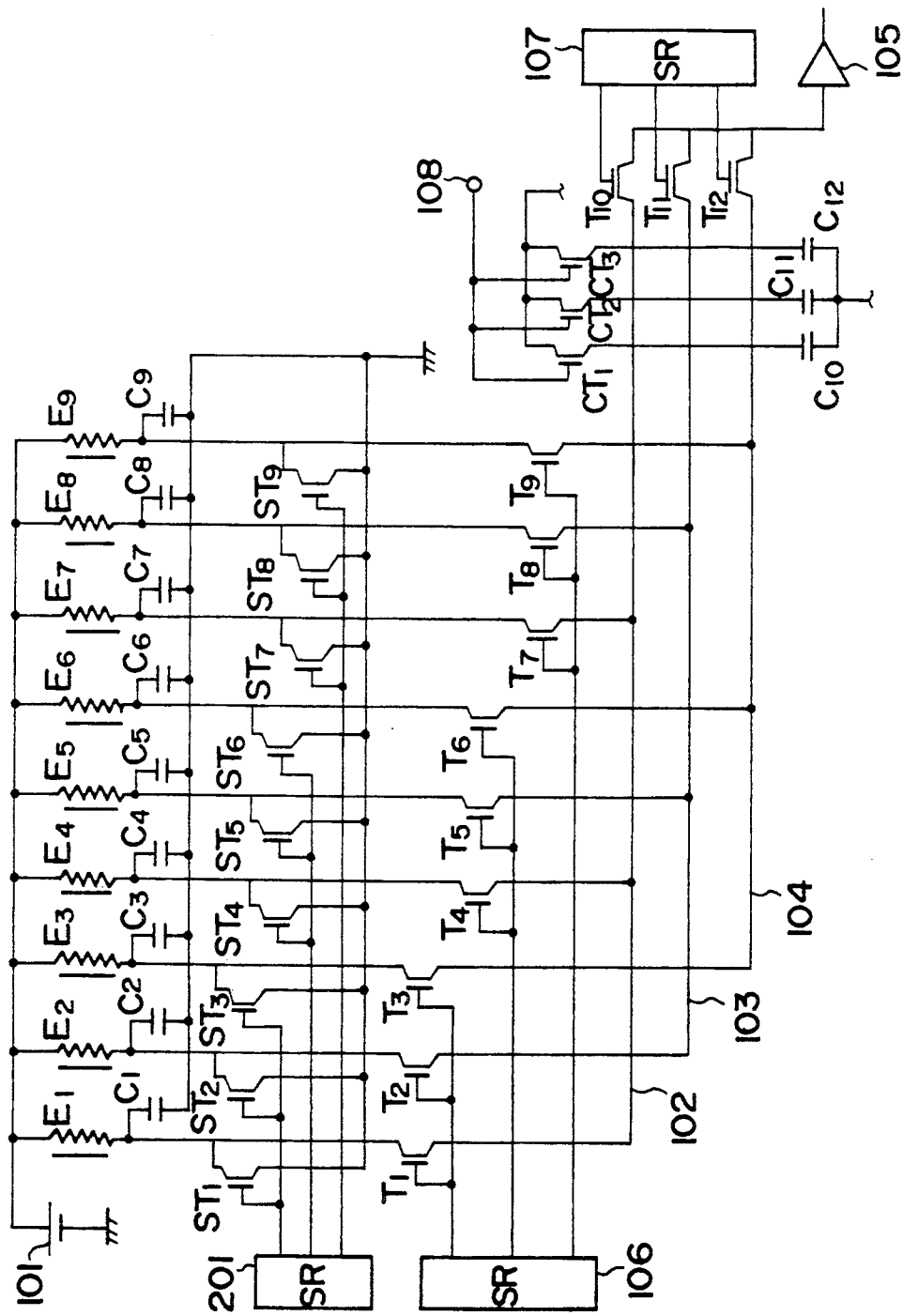
FIG. 22 is the circuit composition drawing to show an example of the circuit of image read-out device.

FIG. 22 is the circuit composition drawing indicating an example of the circuit of one-dimensional sensor array composed of the thin film transistor type optical sensors of the present invention and thin film transistors.

Here, the case of the sensor array having 9 optical sensors shall be described.

In the drawing, as for optical sensors E1-E9, three sensors compose one block and 3 blocks compose the optical sensor array. The same applies to the condensers C1-C9 and switching transistors T1-T9 which correspond to optical sensors E1-E9.

The individual electrodes with the same order in each block of optical sensors E1-E9 are connected to one of the common lines 102-104 respectively via switching transistors T1-T9.

To be more specific, the first switching transistors T1, T4 and T7 of all blocks are connected to the common line 102, the second switching transistors T2, T5 and T8 of all blocks are connected to the common line 103 and the third switching transistors T3, T6 and T9 of all blocks are connected to the common line 104. Common lines 102-104 are connected to amplifier 105 respectively via the switching transistors T10-T12

As in the case of the gate electrodes of switching transistors T1-T9, the gate electrodes of switching transistors ST1-ST9 are commonly connected block by block and they are connected, block by block to the parallel output terminal of shift register 201. Therefore, according to the shift timing of the shift register 201, switching transistors ST1-ST9 become ON one after another block by block.

In FIG. 22, common lines 102-104 are installed via the condensers C10-C12 and they are grounded via the switching transistors CT1-CT3.

Figure 23:
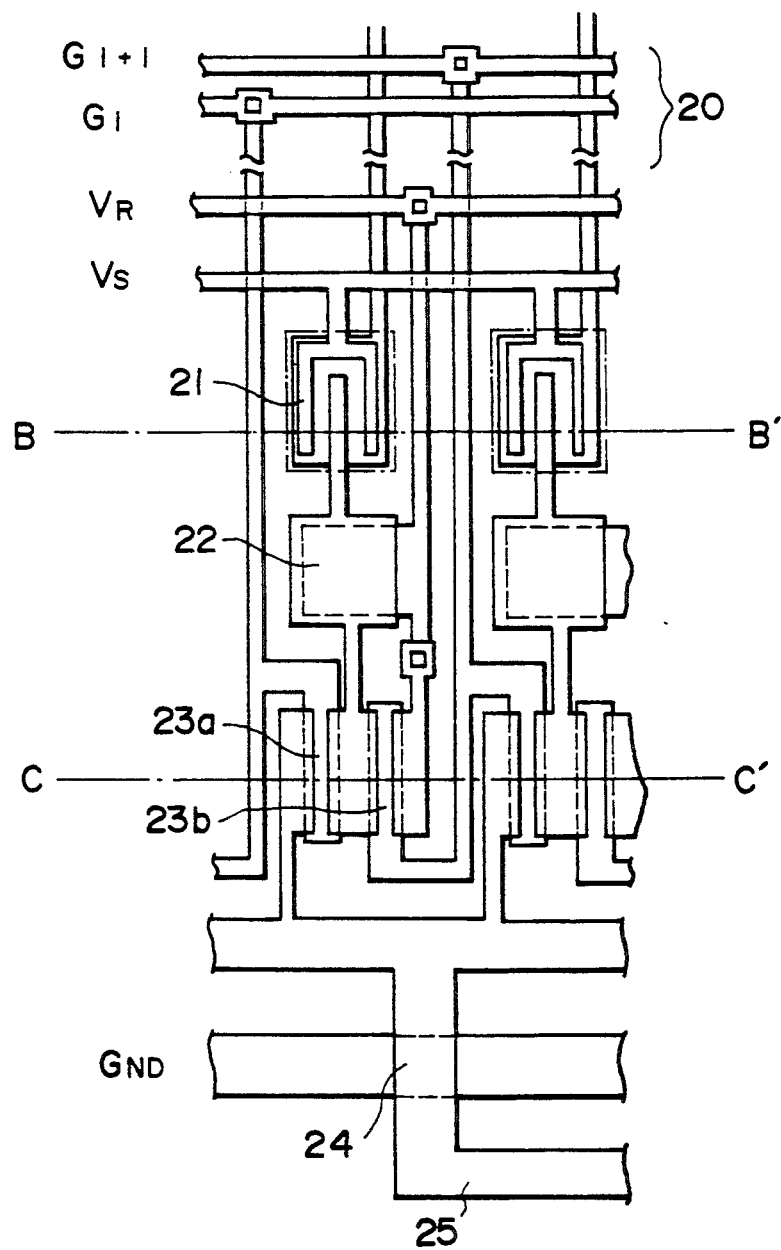
FIG. 23 is the partial plan view of a one-dimensional sensor array prepared based on the circuit indicated in FIG. 22.

The capacities of condensers C10-C12 are made sufficiently larger than those of the condensers C1-C9. The gate electrodes of switching transistors CT1-CT3 are commonly connected and they are connected en bloc to the terminal 108. When a high level voltage is impressed on the terminal 108, the switching transistors CT1-CT3 become ON simultaneously and the common lines 102-104 are grounded. FIG. 23 is the partial plan view of the one-dimensional sensor array prepared based on the circuit drawing of FIG. 22.

In the drawing, 20 is the wiring section formed in the matrix, 21 is the optical sensor section using film transistor type optical sensor according to the present invention, 22 is the electric charge accumulating section, 23a is the transmission switch which uses film transistor according to the present invention, 24b is the discharge switch using film transistor according to the present invention which resets the electric charge of the electric charge accumulating section 22, 25 is the draw-out line to connect the signal output of transfer switch to the signal process IC and 24 is the load condenser to accumulate and read the electric charge transmitted by the transfer switch 23a.

In FIG. 23, to avoid complication, only the upper and lower electrode wirings are shown, omitting the aforesaid photoconductive semiconductor layer and insulation layer. At the boundary of the upper electrode wiring and the semiconductor layer, n+ layer 139 is formed making the ohmic junction.

Figure 24A:
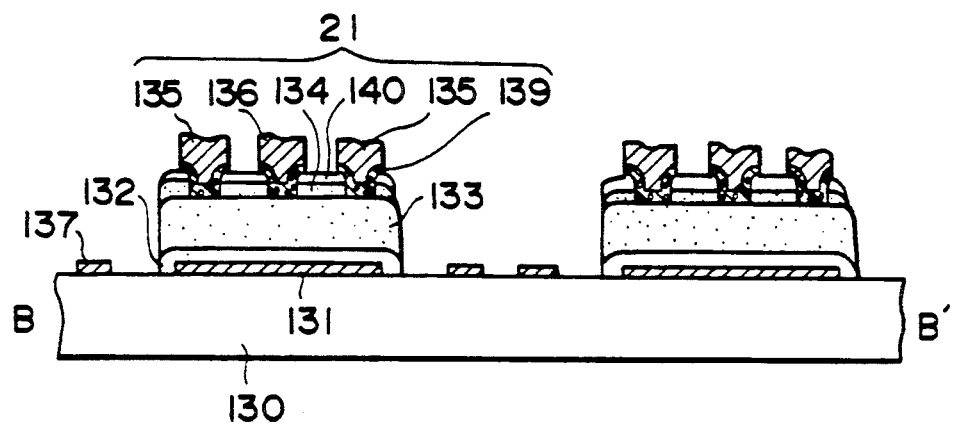
FIGS. 24A and 24B are the partial sectional views of a one-dimensional sensor array prepared based on the circuit shown in FIG. 22.

FIG. 24A indicates the longitudinal sectional view of optical sensor 21, the said optical sensor 21 being composed of the wiring 131 of the lower layer electrode which is the gate electrode, insulation layer 132 which is the gate insulation layer, active semiconductor layer 133, inactive semiconductor layer 134, wiring 136 of the upper layer electrode which is the source electrode, the wiring 135 of the upper layer electrode which is the drain electrode and the protective layer 140. As in the case of embodiment 7, the inactive semiconductor layer and the protective film are applied to the surface of the active semiconductor layer formed between the source and drain electrodes and contact holes which connect the upper layer electrode wiring and the active semiconductor layer are formed at the protective film and at the inactive semiconductor layer.

Figure 24B:
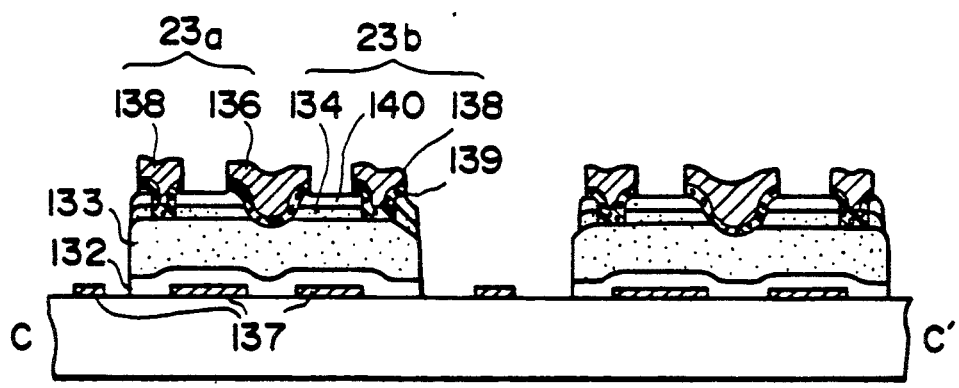

FIG. 24B shows the longitudinal sectional view of transfer switch 23a and discharge switch 23b, the said transfer switch 23a being composed of the wiring 137 of the lower layer electrode which is the gate electrode, insulation layer 132 which is the gate insulation layer, active semiconductor layer 132, inactive semiconductor layer 134, the wiring 136 of the upper layer electrode which is the source electrode, the wiring 138 of the upper layer electrode which is the drain electrode and protective film 140. Discharge switch 23b is constructed in a similar manner to that of the aforesaid transfer switch 23a.

Transfer switch 23a and discharge switch 23b also have, as in the case of the aforesaid optical sensor section, the inactive semiconductor layer and the protective film at the surface of the semiconductor between the source and drain electrodes and the contact holes to connect the upper layer electrode wiring and the active semiconductor layer are formed at the protective film and at the inactive semiconductor layer.

As aforesaid, an ohmic contact layer 139 is formed at the boundary of the upper electrode wirings 135, 136 and 138 and the inactive semiconductor layer 134, of the optical sensor section, transfer switch and discharge switch.

As aforesaid, with the one-dimensional sensor array prepared on a substrate of large area according to the present invention, the active semiconductor layer 133 is protected by the inactive semiconductor layer 134, as in the case of embodiment 6 and the influence of removal by etching of ohmic contact layer of the optical sensor and the electrodes of transfer and discharge switch, the process of formation of protective layer after formation of electrode and the composition of protective film on the characteristics of said array is reduced. As a result, preferred characteristics are obtained uniformly for the entire are of the substrate and preferred ohmic characteristics and a high reliability are obtained.

Figure 25:
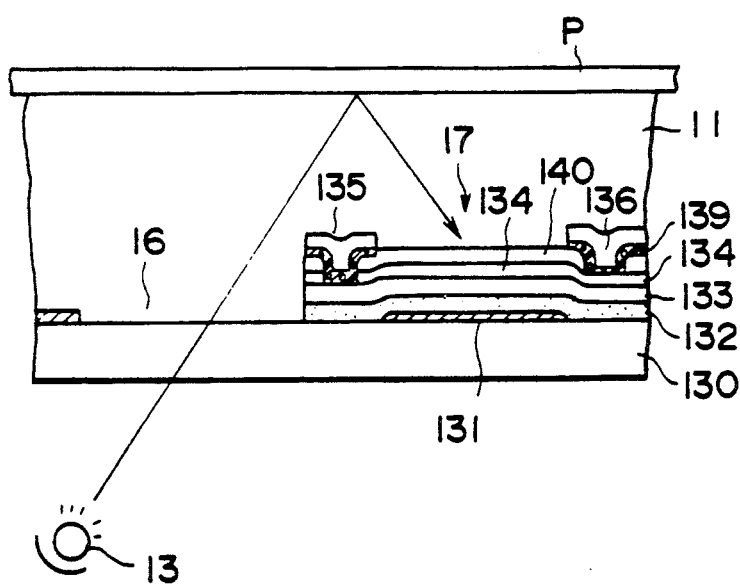
FIG. 25 is an explanatory drawing to show an example of lens-less image reading device of the present invention.

Furthermore, the one-dimensional sensor array of the present invention can be applied either to the image reading device wherein the image of the manuscript is focused at the optical sensor section using the equimultiple focusing lens 12 (for example, Selfoc lens—manufactured by Nippon Sheet Glass Co., Ltd.) as shows in FIG. 14 or the lens-less image reading device wherein the wear-resistant layer 11 is formed at the upper part of the optical sensor and manuscript P is read by irradiating light from behind the sensor by light source 13 as shown in FIG. 25.

In FIG. 14, 14 is a sensor array substrate and 15 is a casing and in FIG. 25, 16 is a light injection window and 17 is the photoelectric conversion section. In FIG. 25, other constituent members are the same as those shown in FIG. 23, FIGS. 24A and 24B and therefore the same symbols are given and their explanations are omitted.

With the embodiments of the present invention described above, hydrogenated amorphous silicon film is used for the active semiconductor layer but the film may contain halogen atoms such as fluorine atoms. For the protective film, polyimide and hydrogenated amorphous silicon nitride film are used but it is not limited to polyimide and nitride film.

As described above, the thin film semiconductor device of the present invention is so constructed that at least an active semiconductor layer, an inactive semiconductor layer and an ohmic layer are laminated one after another on the substrate and an inactive semiconductor layer is provided in between the electrodes formed by the ohmic layer and metal layer. Alternatively, the said device is so constructed that at least an active semiconductor layer, an inactive semiconductor layer and protective layer are laminated one after another on the substrate and the said active semiconductor layer is electrically connected to the ohmic layer and metal layer which form the electrodes, via the contact hole formed at the said protective layer. Therefore, the problems generated due to direct etching of active semiconductor layer between electrodes by RIE etc., the problems as to the process at the formation of protective layer and the problem of fluctuation of band conditions of active semiconductor layer generating depending on the composition of protective layer, etc. are reduced and the freedom of choice of the composition of protective layer made of inorganic material increases. Thus, a protective layer with preferred moisture resistance may be obtained. Furthermore, a device of low cost with excellent electric characteristics with less dispersion of characteristics within the substrate and high reliability as to the environmental stability such as moisture resistance is made available as the film semiconductor devices which meet the requirements of substantially uniform electric characteristics for the entire area of the substrate of large area, i.e., an active matrix type composed of thin film transistor, thin film transistor type optical sensor, co-planar type optical sensor, etc. or photoelectric conversion device such as one-dimensional sensor array.

What is claimed is:

1. A thin film semiconductor device comprising:
    a substrate;
    an active semiconductor layer of amorphous silicon including and hydrogen provided on said substrate;
    a first inactive semiconductor layer provided on said active semiconductor layer, and containing hydrogen at a higher concentration than that of said active semiconductor layer, but not less than 20 percent hydrogen concentration;
    an ohmic layer; and
    a metal layer provided on said ohmic layer.

2. A thin film semiconductor device according to claim 1, further comprising:
    a plurality of planar electrodes comprising said ohmic layer and said metal layer, wherein said first inactive semiconductor layer is deposited between said planar electrode.

3. A thin film semiconductor device according to claim 1, wherein said first inactive semiconductor layer has an energy band gap width which is greater than that of said active semiconductor layer.

4. A thin film semiconductor device according to claim 1, further including a gate electrode and a gate insulating layer, thereby forming a thin film transistor.

5. A thin film semiconductor device according to claim 1, further comprising a gate electrode and a gate insulating layer, thereby forming a thin film transistor type optical sensor.

6. A thin film semiconductor device according to claim 1, wherein said thin film semiconductor device is a coplanar type optical sensor.

7. A thin film semiconductor device comprising:
    a substrate;
    a first active semiconductor layer disposed on said substrate, said active semiconductor comprising amorphous silicon including hydrogen;
    an inactive semiconductor layer disposed on said active semiconductor layer, wherein said first inactive semiconductor layer comprises a hydrogen concentration higher than the hydrogen concentration in said active semiconductor layer, but not less than 20 per cent hydrogen, and said first inactive semiconductor layer has a contact hole;
    an ohmic layer disposed at said contact hole; and
    a metal layer disposed on said ohmic layer.

8. A thin film semiconductor device according to claim 7, further comprising:
    a plurality of planar electrodes comprising at least said ohmic layer and said metal layer, wherein said first inactive semiconductor layer is formed between said planar electrodes.

9. A thin film semiconductor device according to claim 7, wherein said first inactive semiconductor layer has an energy band gap width greater than that of said active semiconductor layer.

10. A thin film semiconductor device according to claim 7, further comprising a gate electrode and a gate insulating layer, thereby forming a thin film transistor.

11. A thin film semiconductor device according to claim 7, further comprising a gate electrode and a gate insulating layer, thereby forming a thin film transistor type optical sensor.

12. A thin film semiconductor device according to claim 7, wherein said thin film semiconductor device is a co planar type optical sensor.

13. A thin film semiconductor device according to claim 3, wherein
    said first inactive semiconductor layer has an energy band gap width which is greater than that of said active semiconductor layer by at least 0.1 eV.

14. A thin film semiconductor device according to claim 13, wherein
    said first inactive semiconductor layer has an energy band gap width greater than that of said active semiconductor layer by 0.1–0.2 eV.

15. A thin film semiconductor device according to claim 3, wherein
said first inactive semiconductor layer has an energy band gap width greater than that of said active semiconductor layer, based on the hydrogen concentration therein.

16. A thin film semiconductor device according to claim 1, further comprising, a second inactive semiconductor layer comprising hydrogen at a concentration higher than that of said active semiconductor layer, but not less than 20%, said second inactive semiconductor layer being disposed between said active semiconductor layer and said substrate.

17. A thin film semiconductor device according to claim 9, wherein said first inactive semiconductor layer has an energy band gap width greater than that of said active semiconductor layer by at least 0.1 eV.

18. A thin film semiconductor device according to claim 17, wherein said first inactive semiconductor layer has an energy band gap width greater than that of said active semiconductor layer by 0.1-0.2 eV.

19. A thin film semiconductor device according to claim 9, wherein the energy band gap width of said first inactive semiconductor layer is greater than that of said active semiconductor layer based on the hydrogen concentration therein.

20. A thin film semiconductor device according to claim 1, further comprising a protective layer.

21. A thin film semiconductor device according to claim 20, therein said protective layer is a material selectee from, the group consisting of hydrogenated amorphous nitride film, polyamide, and nitride film.

22. A thin film semiconductor device according to claim 7, further comprising a protective layer.

23. A thin film semiconductor device according to claim 22, wherein said protective layer is a material selected from, the group consisting of hydrogenated amorphous nitride film, polyamide, and nitride film.

24. A thin film semiconductor device according to claim 9, wherein said active semiconductor layer comprises halogen atoms.

25. A thin film semiconductor device according to claim 24, wherein said halogen atoms comprise fluorine atoms.

26. A thin film semiconductor device according to claim 7, wherein said active semiconductor layer comprises halogen atoms.

27. A thin film semiconductor device according to claim 26, wherein said halogen atoms comprise a fluorine atoms.

* * * * *

UNITED STATES PATENT AND TRADEMARK OFFICE
CERTIFICATE OF CORRECTION

PATENT NO. : 5,150,181
DATED : September 22, 1992
INVENTOR(S) : SHINICHI TAKEDA, ET AL.

It is certified that error appears in the above-identified patent and that said Letters Patent is hereby corrected as shown below:

Title page, item
[56] REFERENCES CITED

Under U.S. PATENT DOCUMENTS, "Oushinsky et al."
    should read --Ovshinsky et al.--.

Under FOREIGN PATENT DOCUMENTS, "62-08559 5/1986 Japan ."
    should read --61-085859 5/1986 Japan .--.

Under OTHER PUBLICATIONS,
    "K. Hiranoko et al." should read --K. Hiranaka et al.--
    (both occurrences).

""Effect of $SiN_x$:H Layered Structure" should read
    --Effect of $SiN_x$:H Composition on Band Bending Near
    the Interface of a-Si:/H a-$SiN_x$:H Layered--.

COLUMN 2

Line 7, "a-Si:H4" should read --a-Si:H--.
Line 15, "aluminium" should read --aluminum--.
Line 31, "(Si3N4)" should read --($Si_3N_4$)--.
Line 32, "(Al2O3)" should read --($Al_2O_3$)--.
Line 54, "thin films" should read --film--.
Line 66, "or" should read --of--.

COLUMN 3

Line 2, "a-SiNx:H)" should read --a-$SiN_x$:H)--.
Line 13, "2(SiNx:H)" should read --2($SiN_x$:H)--.

UNITED STATES PATENT AND TRADEMARK OFFICE
CERTIFICATE OF CORRECTION

PATENT NO. : 5,150,181

DATED : September 22, 1992

INVENTOR(S) : SHINICHI TAKEDA, ET AL.

It is certified that error appears in the above-identified patent and that said Letters Patent is hereby corrected as shown below:

COLUMN 4

Line 3, "7" should be deleted.
Line 16, "contact" should read --content--.
Line 39, "FIG." should read --FIG. 11;--.
Line 52, "with" should be deleted.
Line 54, "5" should be deleted.

COLUMN 5

Line 3, "FIG. 22." should read --FIG. 22; and--.
Line 18, "a ohmic" should read --an ohmic--.
Line 67, "a-SiNx:H)" should read --a-SiN$_x$:H)--.

COLUMN 6

Line 9, "become" should read --becomes--.
Line 38, "manufacture" should read --manufactured--.
Line 42, "SiH4," should read --SiH$_4$,--.
Line 59, "ration" should read --ratio--.

COLUMN 7

Line 10, "300 mm ▫" should read --300 mm ▫)--.
Line 23, "it" should be deleted.
Line 40, "are" should read --is--.
Line 64, "a-SiNx:H" should read --a-SiN$_x$:H--.
Line 66, "a-SiNx:H" should read --a-SiN$_x$:H--.

UNITED STATES PATENT AND TRADEMARK OFFICE
CERTIFICATE OF CORRECTION

PATENT NO. : 5,150,181

DATED : September 22, 1992

INVENTOR(S) : SHINICHI TAKEDA, ET AL.

It is certified that error appears in the above-identified patent and that said Letters Patent is hereby corrected as shown below:

COLUMN 8

Line 2, "Which" should read --which--.

Line 5, "SiH4      should      --SiH$_4$
         NH3       read         NH$_3$
         H2"                    H$_2$--.

Line 46, "it" should be deleted.

COLUMN 9

Line 53, "are" should be deleted.

COLUMN 10

Line 39, "if" should read --is--.

COLUMN 11

Line 19, "a-SiNx:H)" should read --a-SiN$_x$:H)--.

COLUMN 12

Line 15, "399 mm" should read --300 mm--.

COLUMN 13

Line 1, "a-SiNx:H" should read --a-SiN$_x$:H--.
Line 2, "SiNx:H" should read --SiN$_x$:H--.

UNITED STATES PATENT AND TRADEMARK OFFICE
CERTIFICATE OF CORRECTION

PATENT NO. : 5,150,181

DATED : September 22, 1992

INVENTOR(S) : SHINICHI TAKEDA, ET AL.

It is certified that error appears in the above-identified patent and that said Letters Patent is hereby corrected as shown below:

COLUMN 13

Line 8, "$SiH4$ $NH3$ $H2$" should read --$SiH_4$ $NH_3$ $H_2$--.

COLUMN 14

Line 7, "FIG. 19A-19E" should read --FIGS. 19A-19E--.
Line 14, "a-SiNx:H" should read --a-SiN$_x$:H--.
Line 46, "n" should read --in--.

COLUMN 15

Line 31, Close up right margin.
Line 32, Close up left margin.

COLUMN 16

Line 36, "layer 132," should read --layer 133,--.
Line 67, "are" should read --area--.

COLUMN 17

Line 7, "shows" should read --shown--.
Line 65, "and" should be deleted.

COLUMN 18

Line 10, "electrode." should read --electrodes.--.

UNITED STATES PATENT AND TRADEMARK OFFICE
CERTIFICATE OF CORRECTION

PATENT NO. : 5,150,181

DATED : September 22, 1992

INVENTOR(S) : SHINICHI TAKEDA, ET AL.

Page 5 of 5

It is certified that error appears in the above-identified patent and that said Letters Patent is hereby corrected as shown below:

<u>COLUMN 20</u>

Line 6, "therein" should read --wherein--.
Line 7, "lectee from," should read --lected from--.
Line 13, "from," should read --from--.

Signed and Sealed this

Twenty-second Day of February, 1994

BRUCE LEHMAN

Attest:

Attesting Officer

Commissioner of Patents and Trademarks